United States Patent [19]

Koo

[11] 4,032,373
[45] June 28, 1977

[54] METHOD OF MANUFACTURING A DIELECTRICALLY ISOLATED SEMICONDUCTIVE DEVICE

[75] Inventor: Tuh-Kai Koo, Colorado Springs, Colo.

[73] Assignee: NCR Corporation, Dayton, Ohio

[22] Filed: Oct. 1, 1975

[21] Appl. No.: 618,717

[52] U.S. Cl. .................. 148/175; 29/578; 148/189; 156/661; 357/50; 357/55; 427/88
[51] Int. Cl.² .................................. H01L 21/223
[58] Field of Search .......... 156/11, 17, 13; 29/580, 29/578; 427/88, 93, 399; 148/1.5, 187, 189, 175; 357/50, 55

[56] References Cited

UNITED STATES PATENTS

| | | |
|---|---|---|
| 3,005,937 | 10/1961 | Wallmark et al. .................. 357/55 |
| 3,768,150 | 10/1973 | Sloan et al. ........................ 29/580 |
| 3,796,612 | 3/1974 | Allison ............................... 29/580 |
| 3,892,608 | 7/1975 | Kuhn .................................. 156/17 |
| 3,928,091 | 12/1975 | Tachi et al. ........................ 357/50 |
| 3,930,300 | 1/1976 | Nicolay .............................. 29/580 |
| 3,990,927 | 11/1976 | Montier .............................. 156/17 |

*Primary Examiner*—Charles E. Van Horn
*Assistant Examiner*—Jerome W. Massie
*Attorney, Agent, or Firm*—J. T. Cavender; Lowell C. Bergstedt; Lawrence P. Benjamin

[57] ABSTRACT

A matrix array of semiconductor diodes formed in an epitaxial layer of a semiconductor wafer and being dielectrically isolated from each other by two orthogonal sets of parallel insulating oxide regions, one set extending completely through the epitaxial layer and the other set extending only partially through the epitaxial layer. A preferred method of forming the matrix array is also disclosed.

7 Claims, 20 Drawing Figures

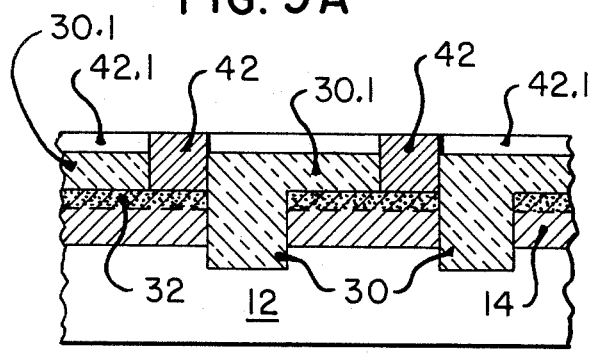
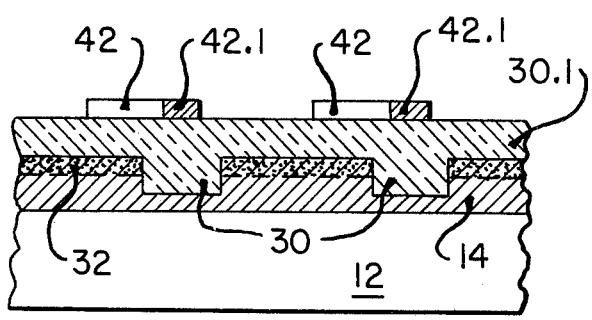
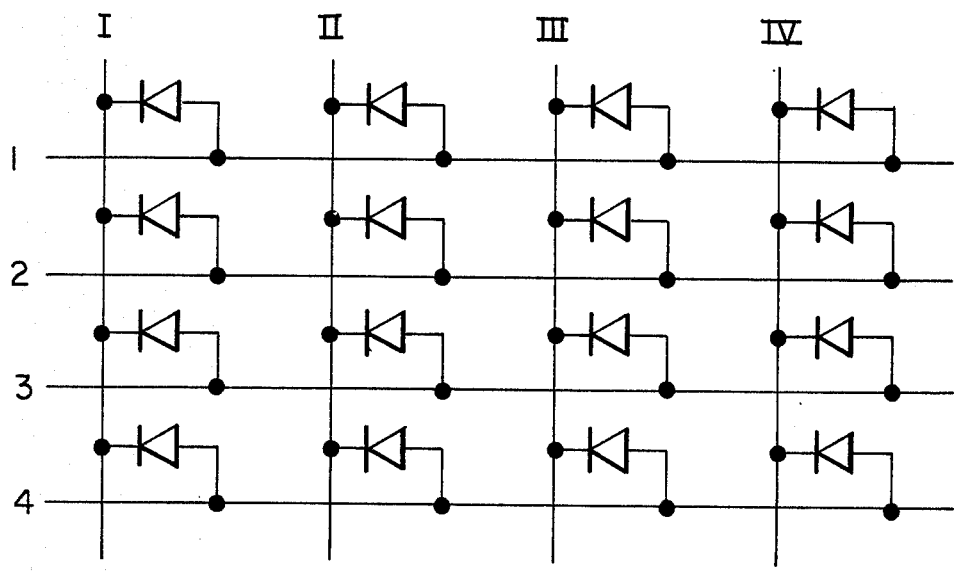

METHOD OF MANUFACTURING A DIELECTRICALLY ISOLATED SEMICONDUCTIVE DEVICE

BACKGROUND OF THE INVENTION

This invention relates to integrated circuits and more particularly to monolithic integrated circuits of the type having diodes (or other circuit components) formed on a common substrate and which are electrically isolated from each other throughout the substrate.

As used herein, the expression "monolithic integrated circuits" refers to a single substrate or wafer of semiconductive material, typically monocrystalline, on (or in) which individual active and/or passive circuit components are formed which, when appropriately interconnected, results in the desired circuit network. Accordingly, such circuit networks require electrical isolation between the various circuit components formed on or in the wafer.

In the past, various techniques have been developed to provide the electrical components with the required electrical isolation, one from another. For example, in one method, an epitaxial layer of semiconductive material is formed upon a substrate of opposite conductivity type and the discrete components are formed in the epitaxial layer. Thereafter, an isolation region is formed by doping the areas surrounding each device with an impurity having the same conductivity type as the substrate. This technique than requires that the device be heated to an elevated temperature in excess of 1,000° C for an extended period of time to create vacancies in the lattice structure of the epitaxial layer to enable the impurity to diffuse through the epitaxial layer and contact the substrate, thus forming the isolation barrier.

This prior art technique has a well known disadvantage in that, in difusing through the epitaxial layer, the dopant tends to diffuse in all directions. The resultant lateral spred of the dopant extends spread a larger area of the substrate than would be required if the dopant were made to diffuse in a vertical direction. Additionally, the high temperatures required to enable the dopant to diffuse through the epitaxial layer may, in certain instances, introduce contaminative impurities into the device and thus impair its characteristics.

SUMMARY OF THE INVENTION

Briefly, and in accordance with the present invention, a semiconductor wafer of one conductivity is provided, on one surface thereof, with an epitaxial layer of semiconductor material of an opposite conductivity and a nitride layer. A first set of substantially parallel grooves are etched through the nitride layer and partially through the epitaxial layer after which a second set of substantially parallel grooves, arranged to cross the first set of grooves, is etched through the nitride layer. The grooved wafer is then subjected to an oxidation step which converts the exposed grooved portions to a insulating oxide. The result is a structure that has a first set of grooves that extend completely through the epitaxial layer and a second set of crossing grooves that extend only partially through the epitaxial layer. The grooves, being filled with an insulator material forms discrete "islands" which are electrically isolated one from another on which circuit components may be fabricated.

It is, therefore, a principal object of the present invention to provide an improved method for fabricating integrated circuits on a semiconductor wafer wherein the individual circuits are dielectrically isolated one from another.

An additional principal object of the present invention is to provide an improved method of fabricating diodes on a semiconductor wafer wherein grooves etched therein provide dielectric isolation between adjacent diodes and the depth of the grooves facilitate the connection of the diodes to rows and columns.

BRIEF DESCRIPTION OF THE DRAWINGS

FIGS. 1A through 9A are a cross-sectional view of the various stages of processing taken through section A—A of FIG. 11;

FIGS. 1B through 9B are a cross-sectional view of the various stages of processing taken through section B—B of FIG. 11;

FIG. 10 is a schematic representation of a diode array formed by my novel process.

DESCRIPTION OF THE PREFERRED EMBODIMENT

Figure 1A:
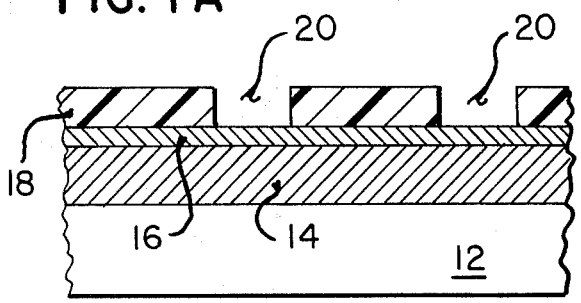
Figure 1B:
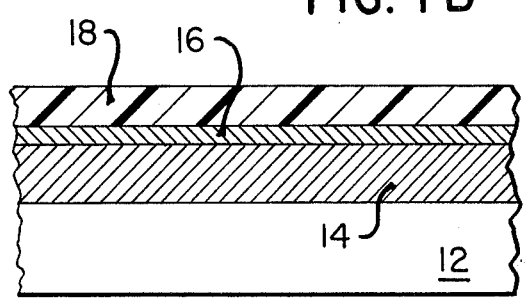
Figure 11:
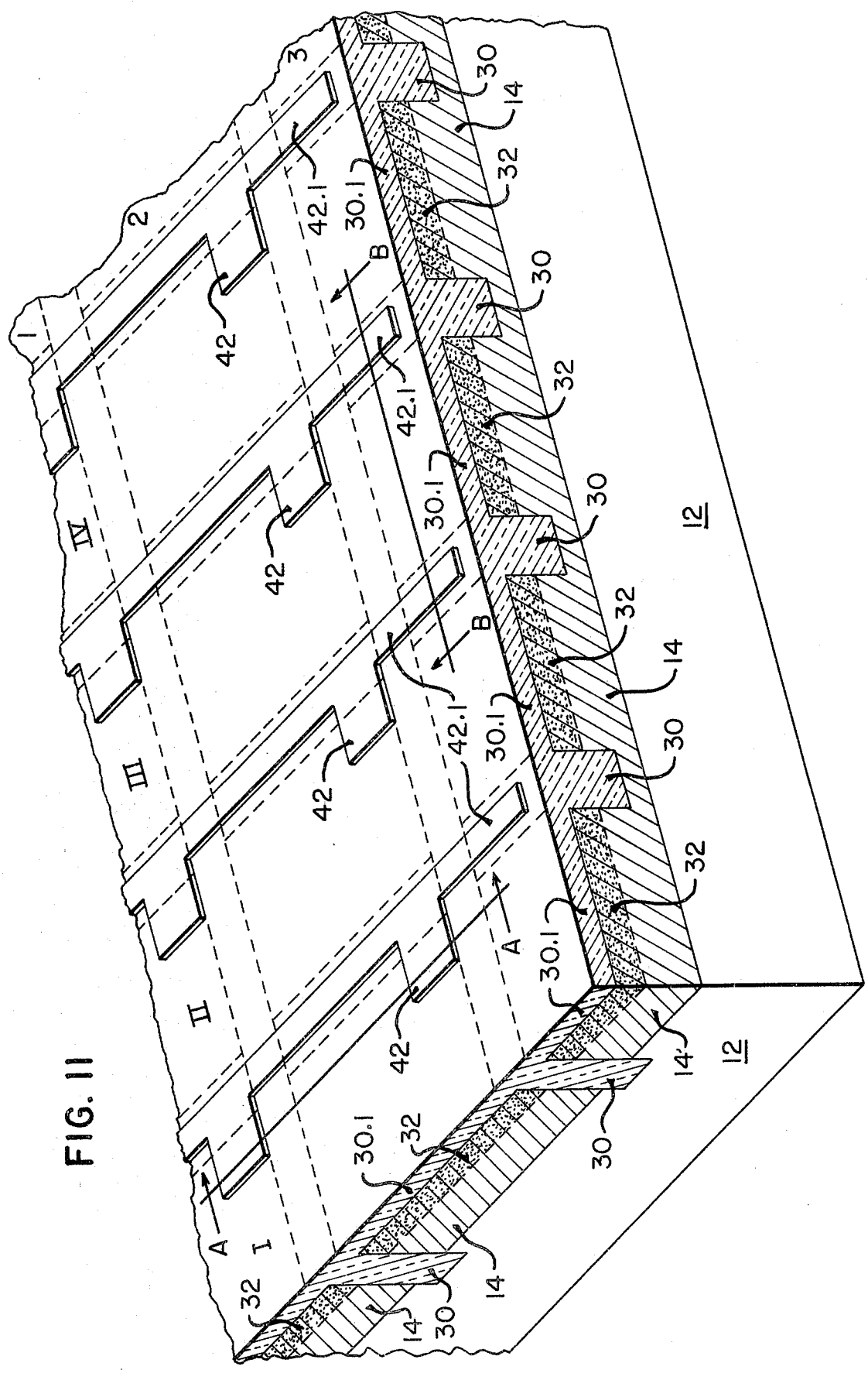
FIG. 11 is a partial cross-sectional, isometric view of my novel device.

Referring now to FIGS. 1A and 1B, there is shown a cross-sectional view taken along lines A—A and B—B respectively of FIG. 11 wherein a P-type semiconductor wafer 12 is shown provided with an N-type epitaxial layer 14 having a nitride layer 16 deposited thereon and photoresistive layer 18 having apertures 20 therein. While substrate 12 and epitaxial layer 14 have been shown as having P and N type conductivities, it will be obvious to those skilled in the semiconductor arts that these conductivities may be reversed without departing from the inventive concept. The reversal of the noted conductivities, together with appropriate changes in diffusion material, will also produce my novel diode array. It should also be obvious to those skilled in the art that semiconductor wafer 12 may be either purchased commercially with epitaxial layer 14 grown thereon or may be grown by the user prior to the deposition of silicon nitride layer 16.

Figure 2A:
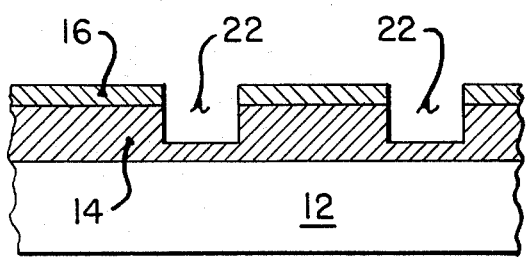
Figure 2B:
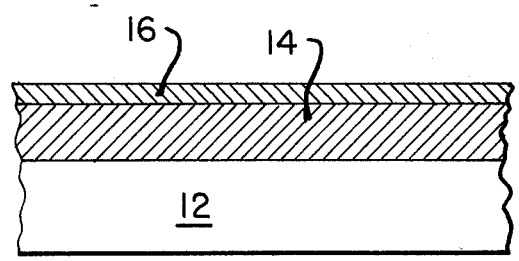

Apertures 20 are utilized to define subsequent "deep cut", parallel grooves (as distinguished from the "shallow cut") as will be hereinafter defined. Having provided the structure of FIGS. 1A and 1B, a first nitride etch is performed on the structure so as to etch the portions of nitride layer 16 exposed by apertures 20. Thereafter, as shown in FIGS. 2A and 2B, photoresist layer 18 is removed from the structure and the now etched nitride layer 16 is used as a mask for a subsequent silicon etch of layer 14, thus providing the initial step in the subsequent formation of the parallel deep cut grooves.

Figure 3A:
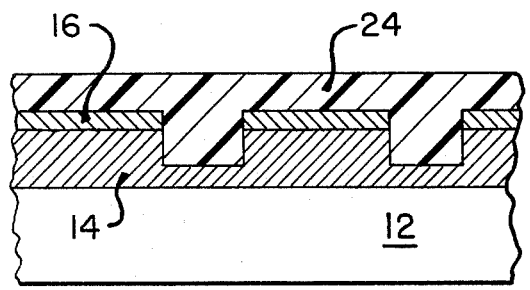

Having accomplished the initial step for the deep cut parallel grooves, the structure is now provided with another photoresist layer 24, having apertures 26 therein (FIG. 3B), with layer 24 filling apertures 22 formed by the prior etching step (FIG. 3A).

Figure 3B:
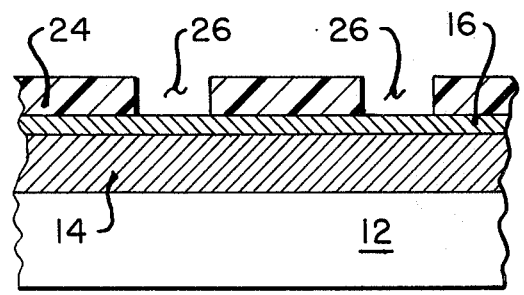
Figure 4A:
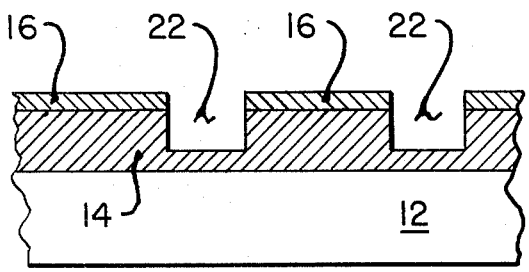
Figure 4B:
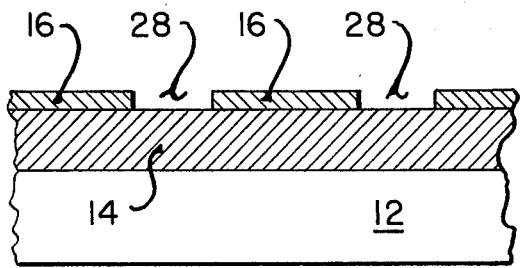
Figure 5A:
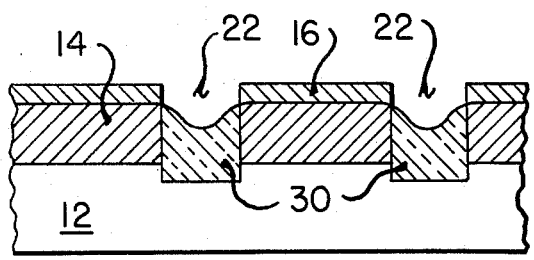
Figure 5B:
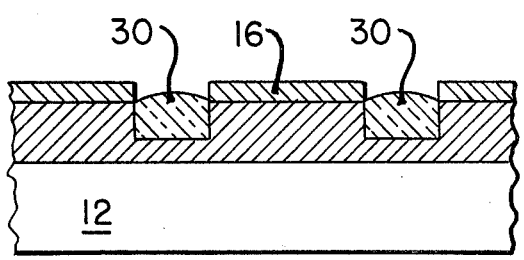

Referring now to FIGS. 4A and 4B it will be seen that another nitride etching step is performed on the structure of FIGS. 3A and 3B to etch the parallel grooves in nitride layer 16 exposed by apertures 26. Photoresist layer 24 is then removed and the resulting structure is a plurality of grooves, shown in section as apertures 28 (FIG. 4B), in nitride layer 16 and represents the first step in the production of the pattern of parallel shallow grooves. Thus, with nitride layer 16 provided with apertures 22 (FIG 4A) and 28 (FIG. 4B) it may now be used as a mask for the formation or growth of oxide 30 in apertures 22 and 28 as shown in FIGS. 5A and 5B. This oxide may, for example, be grown using steam at approximately $1000° \pm 100°$ C for a period of about 12 hours.

Figure 6A:
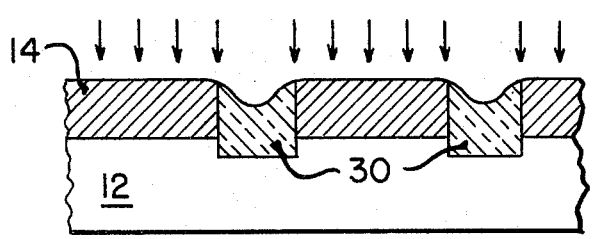
Figure 6B:
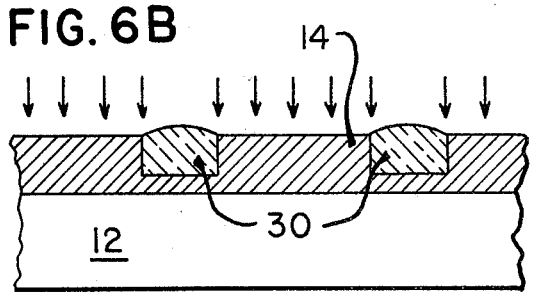

Thereafter, as shown in FIGS. 6A and B, the junction is diffused into epi layer 14 to form my novel device. This junction is formed, for example, by the diffusion of Boron Tribromide ($BBr_3$) into N-epi layer 14 at a furnace temperature of about $1050° \pm 10°$ C. Nitrogen is used as a primary carrier flowing at the rate of approximately 2950 cc per minute together with oxygen flowing at the rate of about 20 cc per minute is caused to flow through a bubbler containing 99.99% $BBr_3$ which is maintained at about 24° C. The boron doping is carried on until such time as layer 24 is doped for the required thickness, thus forming P-doped areas 32 (FIGS. 7A and 7B) which overlies N-epi areas 14 to form the required P-N junction and thus, a diode.

Figure 7A:
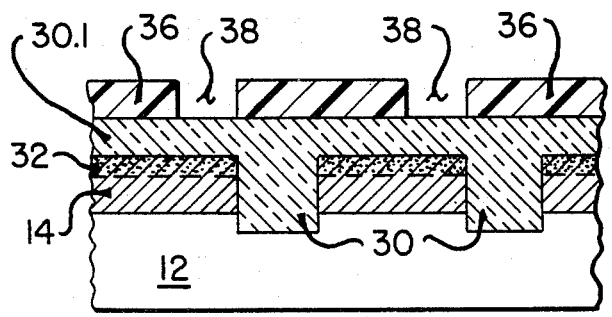
Figure 7B:
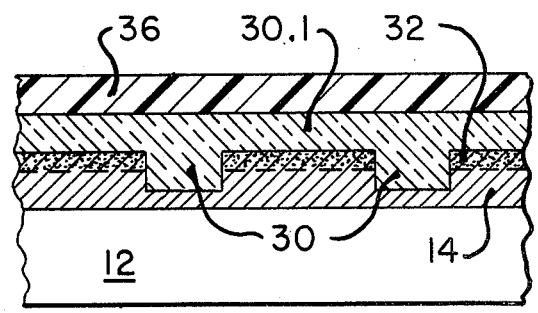
Figure 8A:
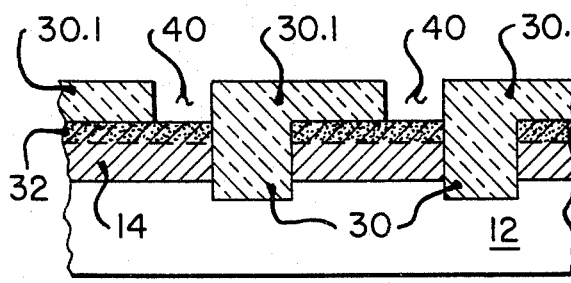
Figure 8B:
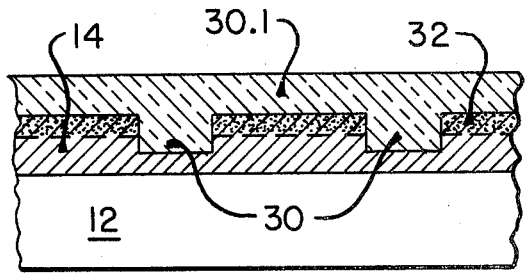

Referring to FIGS. 7A and 7B, my process requires that oxide layer 30.1 be grown over the exposed now doped areas 32 as well as oxide areas 30 for both the deep cut and the shallow cut. This oxide may be grown, for example, at a temperature of about 1000° C utilizing dry oxygen for a sufficient period of time to form a thin, transparent layer about 1 micron thick, as is well known in the art.

Having now provided my novel device with a P-N junction (32-14) covered with a thin passivating oxide layer 30.1, it is now necessary to provide the required contacts to the various discrete elements, which, together with the appropriate lead lines, forms the array. This is accomplished by first providing the structure with a photoresistive mask 36 having apertures 38 therein wherein the apertures define the areas for the subsequent contact holes. In the embodiment shown, the contacts will be positioned at a corner of each P-N junction with the connecting leads running atop the oxide dividers 30 which act as insulators. To accomplish the formation of the contacts, the device is then subjected to an oxide etch which etches selected exposed portions of oxide layer 30.1 to form apertures 40 in oxide layer 30.1.

Thereafter, as shown in FIGS. 9A and 9B, metallic, conductive contacts 42 are deposited in apertures 40 to provide ohmic contacts to P-layer 32 while metallic, conductive lead line 42.1 provide ohmic connections to contacts 42. This may be done by either sputtering through another mask (not shown) or by an anodization technique (not shown) both methods being well known.

Referring now to FIG. 11, there is shown in partial section, an isometric view of my novel device consisting of P-type substrate 12 having an N-epitaxial layer 14 deposited thereon. However, by reason of the processing just described, N-epitaxial layer 14 is divided into rows 1, 2 and 3 due to deep cuts 22 and the deposition of oxide 30 therein (FIG 4A). The P-diffused areas 32, together with its associated areas of N-epitaxial layer 14, form the discrete P-N junction and thus, a diode. The diodes in each column (I, II, III and etc.) are separated from each other by reason of oxide 30 in deep cuts 22 (FIG. 4) while the diodes in each row (1, 2, 3 and etc.) are separated from each other by reason of oxide 30 in shallow cuts 22 (FIG. 4B). Further, contacts 42 provide the required ohmic connection to P-diffused areas 32 and each contact 42 is connected to corresponding P-type areas in the same column by reason of conductive leads 42.1.

Referring now to FIG. 10, it will thus be seen that a diode array is presented wherein the cathodes of each of the active devices in Column I are all connected together while all similar cathodes in Column II are connected to each other. To complete the array, the first anode of each diode of each row is connected together while similarly the anodes in rows 2, 3 and 4 are connected to a respective anode in the same row.

It should now become obvious to those skilled in the art that utilizing the proper driver circuitry as an input to the rows or columns of my array, one can readily determine the conductivity of the discrete P-N junction by appropriately interrogating the rows and columns, in accordance with well known techniques.

While the FIGS. 1–9 and 11 depict the grooves as being parallel and perpendicular with respect to each other, it will be obvious to those skilled in the art that while the parallelism is desired it is not necessary to have the crossing lines perpendicular to each other, as shown in FIG. 11. The important consideration being that the discrete islands be of the same general area so that they exhibit similar characteristics, Accordingly, it is not my intention to be limited to perpendicular crossings of deep and shallow grooves.

What is claimed is:

1. A method of forming dielectrically isolated islands in a semiconductor body comprising the steps of:
    selecting a semiconductor wafer of a given conductivity-type;
    providing one surface of the wafer with a layer of epitaxial semiconductor material of an opposite conductivity-type;
    forming a first set of parallel regions of electrically insulating material extending completely through the epitaxial layer;
    forming a second set of parallel regions of electrically insulating material crossing the first set of regions and extending only partially through the epitaxial layer; and
    forming circuit components in the islands of the epitaxial layer isolated by said regions of electrically insulating material.

2. The method of claim 1, wherein:
    the first set of parallel regions is formed by etching only partially through the epitaxial layer in the thickness direction to form a first set of grooved regions in the epitaxial layer and then growing an oxide of the wafer material in the grooved regions to a depth sufficient to form an oxide region extending completely through the epitaxial layer.

3. The method of claim 2 wherein:
    the islands are formed by growing an oxide of the wafer material in parallel regions of the epitaxial layer crossing the grooved regions to a depth less than the thickness of the epitaxial layer simultaneously with the growing of an oxide in the grooved regions.

4. A method of forming a matrix array of dielectrically isolated diodes in a semiconductor body comprising the steps of:
    selecting a semiconductor wafer of a given conductivity-type with an epitaxial layer of an opposite conductivity-type on one surface thereof;

forming a first set of parallel insulating oxide regions extending completely through said epitaxial layer;

forming a second set of parallel insulating oxide regions crossing said first set of regions and extending only partially through said epitaxial layer;

converting individual regions of said epitaxial layer surrounded by said insulating oxide regions from said opposite conductivity-type to said given conductivity-type to form a semiconductor diode in each of said individual regions; and providing ohmic connections to said diodes to produce an interconnected array.

5. The method of claim 4 wherein the steps of forming the first and second sets of insulating oxide regions comprises the steps of:

depositing a silicon nitride layer on the epitaxial layer;

forming a first patterned layer of masking material on the silicon nitride layer to define a first set of parallel exposed regions of silicon nitride;

etching through said first set of exposed regions of silicon nitride to produce a corresponding first set of parallel exposed regions of said epitaxial layer;

removing the first patterned layer of masking material;

etching partially through said exposed regions of epitaxial layer to form a set of parallel grooved regions therein;

forming a second patterned layer of masking material on both the silicon nitride layer and the exposed grooved regions of the epitaxial layer to define a second set of parallel exposed regions of silicon nitride crossing said set of parallel grooved regions in said epitaxial layer;

etching through said second set of exposed regions of silicon nitride to produce a corresponding second set of parallel exposed regions of epitaxial layer;

removing said layer of masking material to expose said set of parallel grooved regions;

growing first and second sets of insulating oxide regions in said set of parallel grooved regions and said second set of parallel exposed regions of said epitaxial layer, respectively, to a depth such that each of said first set of insulating oxide regions extends completely through said epitaxial layer and each of said second set of insulating oxide regions extends only partially through said epitaxial layer; and removing said layer of silicon nitride to expose individual regions of said epitaxial layer isolated by said insulating oxide regions.

6. The method of claim 5 wherein the step of converting the epitaxial layer comprises the steps of:

subjecting the etched wafer to a Boron Tribromide diffusion at a temperature of about 1000° C;

using nitrogen as a primary carrier flowing at the rate of approximately 3000 cc per minute and oxygen flowing at a rate of about 20 cc per minute.

7. The method of claim 6 wherein the step of forming ohmic connections comprises the steps of:

forming a layer of oxide material over the converted epitaxial layer and the grooves;

etching contact holes in the layer of oxide in alignment with each of the islands; and forming a metallic line on the oxide layer and in the contact holes in ohmic contact with corresponding islands in each row.

* * * * *